United States Patent [19]

Koike et al.

[11] Patent Number: 5,042,026
[45] Date of Patent: Aug. 20, 1991

[54] CIRCUIT FOR CANCELLING WHOLE OR PART OF A WAVEFORM USING NONRECURSIVE AND RECURSIVE FILTERS

[75] Inventors: Shin'ichi Koike; Masaru Yamaguchi; Masanobu Arai, all of Tokyo; Takenori Ogata, Miyagi, all of Japan

[73] Assignee: NEC Corporation, Tokyo, Japan

[21] Appl. No.: 161,808

[22] Filed: Feb. 29, 1988

[30] Foreign Application Priority Data

Mar. 3, 1987 [JP] Japan .................................. 62-46740
Oct. 14, 1987 [JP] Japan ................................ 62-259282
Oct. 14, 1987 [JP] Japan ................................ 62-260227

[51] Int. Cl.$^5$ ............................................. H04J 3/00
[52] U.S. Cl. ................................. 370/32.1; 379/406; 379/410; 379/411
[58] Field of Search ...................... 379/406, 410, 411; 370/32.1, 32; 333/18, 28 R; 364/724.01; 375/12, 14, 103

[56] References Cited

U.S. PATENT DOCUMENTS

| | | | |
|---|---|---|---|
| 4,016,410 | 4/1977 | Eggermont | 235/156 |
| 4,057,696 | 11/1977 | Gitlin et al. | 379/411 |
| 4,321,705 | 3/1982 | Nimiki | 333/18 X |
| 4,747,068 | 5/1988 | Voorman et al. | 364/724 |
| 4,868,874 | 9/1989 | Tokatori et al. | 379/411 |

OTHER PUBLICATIONS

"Architecture for Fully Integrated Echo Canceller LSI Based on Digital Signal Processing", Takatori et al., IEEE International Communication Conference, Jun. 7-10, 1987, Seattle Wash., pp. 0601-0605.

"Mixed Recursive Echo Canceller", Mogavero et al., IEEE International Communication Conference, 1986, pp. 0044-0048.

Primary Examiner—Jin F. Ng
Assistant Examiner—Jhancy Augustus
Attorney, Agent, or Firm—Sughrue, Mion, Zinn, Macpeak & Seas

[57] ABSTRACT

The whole or part of a waveform is cancelled by a circuit comprising a nonrecursive filter and a recursive filter. The nonrecursive filter has a plurality of first multipliers having first tap weights for modifying symbols successively shifted along a shift register. The recursive filter is connected in a series circuit to the shift register and has a second tap weight for recursively modifying the output of the shift register. The recursively modified symbol is modified by a second multiplier having a third tap weight and combined in an adder with the symbols modified by the first tap weights to produce a replica of an undesired waveform. The replica is destructively combined in a subtractor with an incoming symbol having an undesired waveform. The output of subtractor is utilized to derive the tap weights to adaptively control the inputs to the adder.

33 Claims, 8 Drawing Sheets

CIRCUIT FOR CANCELLING WHOLE OR PART OF A WAVEFORM USING NONRECURSIVE AND RECURSIVE FILTERS

BACKGROUND OF THE INVENTION

The present invention relates generally to waveform correction, and more specifically to a circuit for cancelling whole or part of a waveform using a digital filtering technique. The invention is particularly useful for cancelling echo returning from a hybrid interface between a four-wire and a two-wire section of a digital transmission system or cancelling intersymbol interference that occurs between successive digital waveforms.

Conventional echo cancellers and decision feedback equalizers for digital transmission employ a nonrecursive filter (or alternatively called, transversal or finite impulse response filter) having a plurality of tap weights which are adaptively controlled in accordance with the waveform of an incoming symbol so that it produces a replica of the undesired waveform to be destructively combined with the incoming symbol. Because of the finite numbers of the tap weights, the nonrecursive filter is not capable of completely cancelling a long tail portion of the undesired waveform which occurs as a result of the low-frequency cutoff characteristic of a line transformer. It is not practical to provide as many tap weights as necessary to cancel the tail of a waveform.

SUMMARY OF THE INVENTION

It is therefore an object of the present invention to cancel an undesired waveform having a long tail portion in an economical manner.

The object of the invention is achieved by the provision of a recursive (infinite impulse response) filter in a series circuit with the shift register of a nonrecursive filter by which an incoming symbol is successively delayed by a unit time interval. The nonrecursive filter has a plurality of first multipliers having first tap weights for respectively modifying a series of successive symbols, the modified symbols being summed in an adder. The recursive filter has a second tap weight for recursively modifying an output of the shift register. The output of the recursive filter is further modified by a third tap weight of a second multiplier and applied to the adder to produce a replica of an undesired waveform. The replica is destructively combined with an incoming symbol by a subtractor. The output of subtractor is utilized to derive the first and third tap weights to adaptively control the inputs to the adder.

In a preferred embodiment, the first tap weights are derived from a plurality of first modifiers for modifying the successive symbols in the nonrecursive filter with the output of the subtractor. The second tap weight is derived from a second recursive filter by recursively modifying the output of the second multiplier with the second tap weight and further modifying the output of the second recursive filter with the output of the subtractor.

In an alternative embodiment, the second tap weight assumes a value equal to an attenuation coefficient of a transmission medium, and the third tap weight assumes a value equal to one of the first tap weights. In a further alternative embodiment, the second tap weight is derived as a function of the ratio between two of the first tap weights and deter of the first tap weights including said one of the first tap weights.

BRIEF DESCRIPTION OF THE DRAWINGS

The present invention will be described in further detail with reference to the accompanying drawings, in which:

FIG. 1a shows details of each of the integrators of FIG. 1;

DETAILED DESCRIPTION

Referring now to FIGS. 1 through 6, digital filters according to embodiments of the present invention are illustrated.

Figure 1:
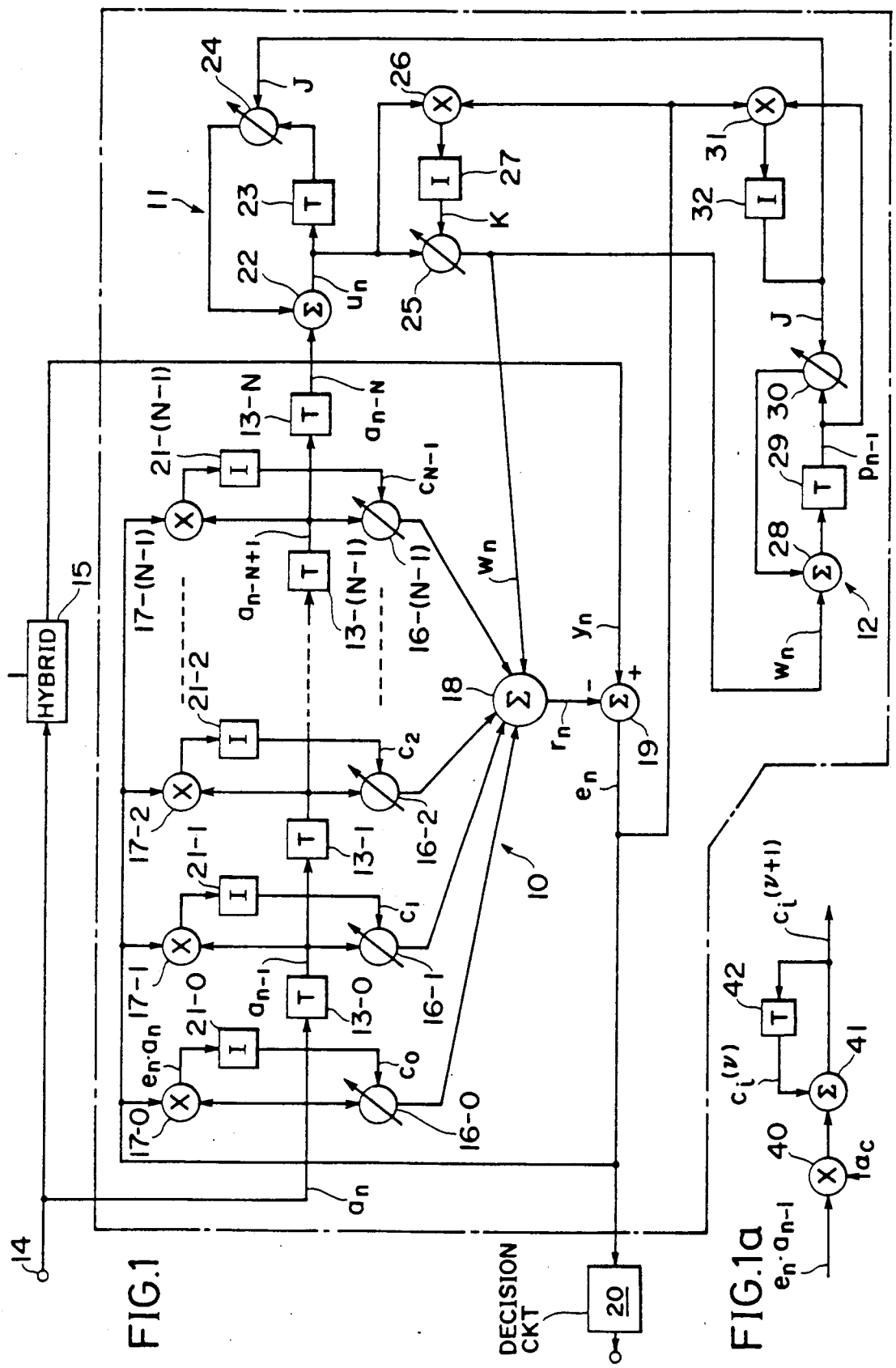
FIG. 1 is a block diagram of an echo canceller according to a first embodiment of the invention.

The digital filter of FIG. 1 is an echo canceller for cancelling echoes generated by the transhybrid coupling at the interface between a four-wire section and a two-wire section of a digital transmission system. The digital filter generally comprises a nonrecursive, or finite impulse response (FIR) filter 10, and first and second recursive, or infinite impulse response (IIR) filters 11 and 12.

Nonrecursive filter 10 includes a series of unit-time delay elements 13-0 through 13-N typically implemented by a conventional shift register. The shift register is clocked so that each unit delay time corresponds to the interval T between successive symbols. The input of the shift register, or delay element 13-0, is connected to receive a digital bit stream "$a_n$" applied to a "go-path" terminal 14 which is connected to a hybrid 15 for transmission over a two-wire section of the transmission system. The input terminals of delay elements 13-0 through 13-N are connected respectively to adaptive multipliers 16-0 through 16-(N-1) on the one hand and to multipliers 17-0 through 17-(N-1) on the other hand. The outputs of adaptive multipliers 16 are summed in an adder 18 whose output is fed as an echo replica "$r_n$" to a subtractor 19 to cancel echo contained in a "return-path" signal "$y_n$" from hybrid 15. Subtractor 19 produces an output "$e_n$" which is supplied to a decision circuit 20 and to all multipliers 17-0 through 17-(N-1). These multipliers supply multiplication outputs $e_n \cdot a_n$, $e_n \cdot a_{n-1}, \ldots e_n \cdot a_{n-N+1}$ to integrators 21-0, 21-1, ... 21-(N-1), respectively. Integrators 21-0 through 21-(N-1) supply tap weights $C_0, C_1, \ldots C_{N-1}$ to the control terminals of adaptive multipliers 16-0 through 16-(N-1), respectively.

Recursive filter 11 comprises an adder 22, a unit-time (=T) delay element 23, and an adaptive multiplier 24. Adder 22 provides summation of the output of nonrecursive filter 10 from delay element 13-N and the output of multiplier 24 to produce an output "$u_n$" which is applied through delay element 23 to multiplier 24 having a variable weighting factor "J". The output of adder 22 is also applied to an adaptive multiplier 25 whose output "$w_n$" is summed with the outputs of multipliers 16 by adder 18. The tap weight "K" of multiplier 25 is derived from multiplication of signals "$u_n$" and "$e_n$" by a multiplier 26 and integration of the output of multiplier 26 by an integrator 27.

Second recursive filter 12 comprises an adder 28 which provides summation of the signal "$w_n$" and an output of a variable multiplier 30 and feeds the multiplier 30 through a unit-time delay element 29 to produce an output "$p_n$" which is multiplied by the factor "J" to be fed back to adder 28. The tap weight "J" for multipliers 24 and 30 is derived from multiplication of signals "$e_n$" and "$p_{n-1}$" by a multiplier 31 and integration of the output of multiplier 31 by an integrator 32.

Echo replica "$r_n$" is given by:

$$r_n = \sum_{i=0}^{N-1} C_i \cdot a_{n-i} + K \cdot u_n \quad (1)$$

where, $u_n$ is represented by a recurrence formula given by $a_{n-N} + J \cdot u_{n-1}$. This recurrence formula represents a recursive filter having a characteristic $1/(1-J.z^{-1})$. Since $e_n = y_n - r_n$, the relation $\epsilon \Delta E[e_n^2]$ holds, where $\epsilon$ represents an average of squared residual echo and E represents an expectation. The tap weights $C_i$ (i=0, 1, 2 ... N-1), J and K are determined by minimizing the average of squared residual echo by the following partial differential equations:

$$\frac{\partial \epsilon}{\partial C_i} = -2E\left[e_n \frac{\partial r_n}{\partial C_i}\right] = -2E[e_n \cdot a_{n-i}] \quad (2)$$

$$\frac{\partial \epsilon}{\partial K} = -2E\left[e_n \frac{\partial r_n}{\partial K}\right] = -2E[e_n \cdot u_n] \quad (3)$$

$$\frac{\partial \epsilon}{\partial J} = -2E\left[e_n \frac{\partial r_n}{\partial J}\right] = -2E\left[e_n \frac{\partial K \cdot u_n}{\partial J}\right]$$

Since $\partial K \cdot u_n / \partial J$ is given by:

$$K \cdot u_{n-1} + K \cdot J \frac{\partial u_{n-1}}{\partial J}$$

and since $w_n = K \cdot u_n$ and $\partial w_{n+1}/\partial J = p_n$, the following relation holds:

$$p_n = w_n + J \cdot p_{n-1}$$

Therefore, $$\frac{\partial \epsilon}{\partial J} = -2E[e_n \cdot p_{n-1}] \quad (4)$$

As shown in FIG. 1a, each of the integrators described above preferably comprises a multiplier 40, an adder 41 having a first input connected to the output of multiplier 40, and a unit-time delay element 42 connected in a feedback path between the output of adder 41 and a second input of adder 41. In the case of integrators 21-0 through 21-(N-1), multiplier 40 corrects the output signal $e_n \cdot a_{n-i}$ from the associated multiplier 17 with a coefficient $\alpha_C$. Adder 41 sums the output of multiplier 40 with a unit-time delayed output $C_i^{(\nu)}$ from delay element 42 to produce an output $C_i^{(\nu+1)}$, where i ranges from 0 to N-1. Therefore, the tap weights $C_0$ through $C_{N-1}$ for multipliers 16-0 through 16-(N-1) are given by:

$$C_i^{(\nu+1)} = C_i^{(\nu)} + \alpha_C \cdot e_n \cdot a_{n-i} \quad (5)$$

Likewise, the tap weights J and K are given by:

$$K^{(\nu+1)} = K^{(\nu)} + \alpha_K \cdot e_n \cdot u_n \quad (6)$$

$$J^{(\nu+1)} = J^{(\nu)} + \alpha_J \cdot e_n \cdot p_{n-1} \quad (7)$$

Figure 7:
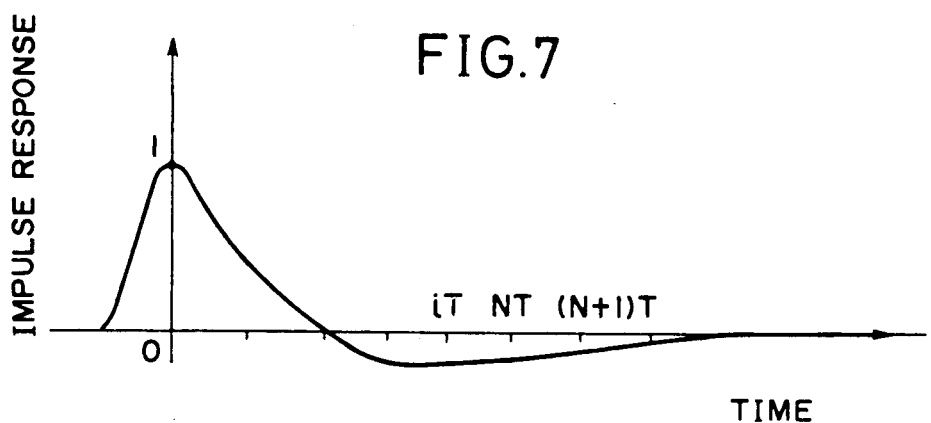
FIG. 7 is a typical waveform of an impulse response.
Figure 8:
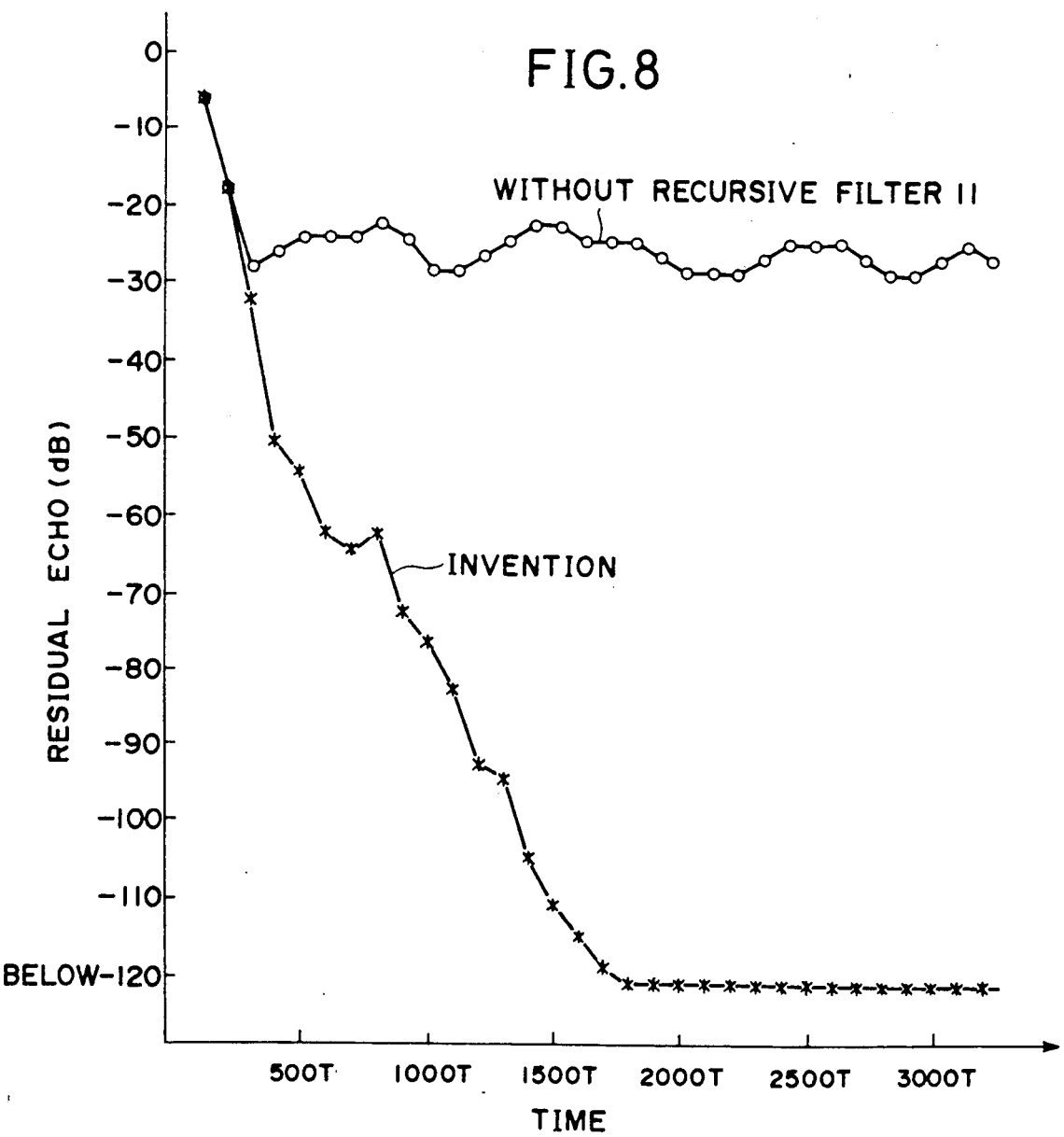
FIG. 8 is a graph showing the results of a simultation test conducted on an echo canceller of the invention in comparison with an echo canceller having no recursive filter.

The operating characteristic of the echo canceller of FIG. 1 was verified by performing a simulation technique on an echo shown at FIG. 7 having a negative exponential decay response at a low cut-off frequency which corresponds to 1/200 of the data transmission speed. In this simulation test, the nonrecursive filter 10 was provided with 32 taps (N=32) to cancel the major part of the echo replica. At time t=NT, the amplitude of the echo was −0.0118. To cancel the tail of an echo, the tap weights K and J of the recursive filter 11 were −0.0118 and 0.96907 (=$e^{2\pi/200}$), respectively. With initial values for $C_i^{(0)}$, $K^{(0)}$ and $J^{(0)}$ being set equal to 0, 0 and 1, respectively, the tail of the echo was successfully cancelled as indicated in FIG. 8, which favorably compares with the prior art having no recursive filter.

Figure 2:
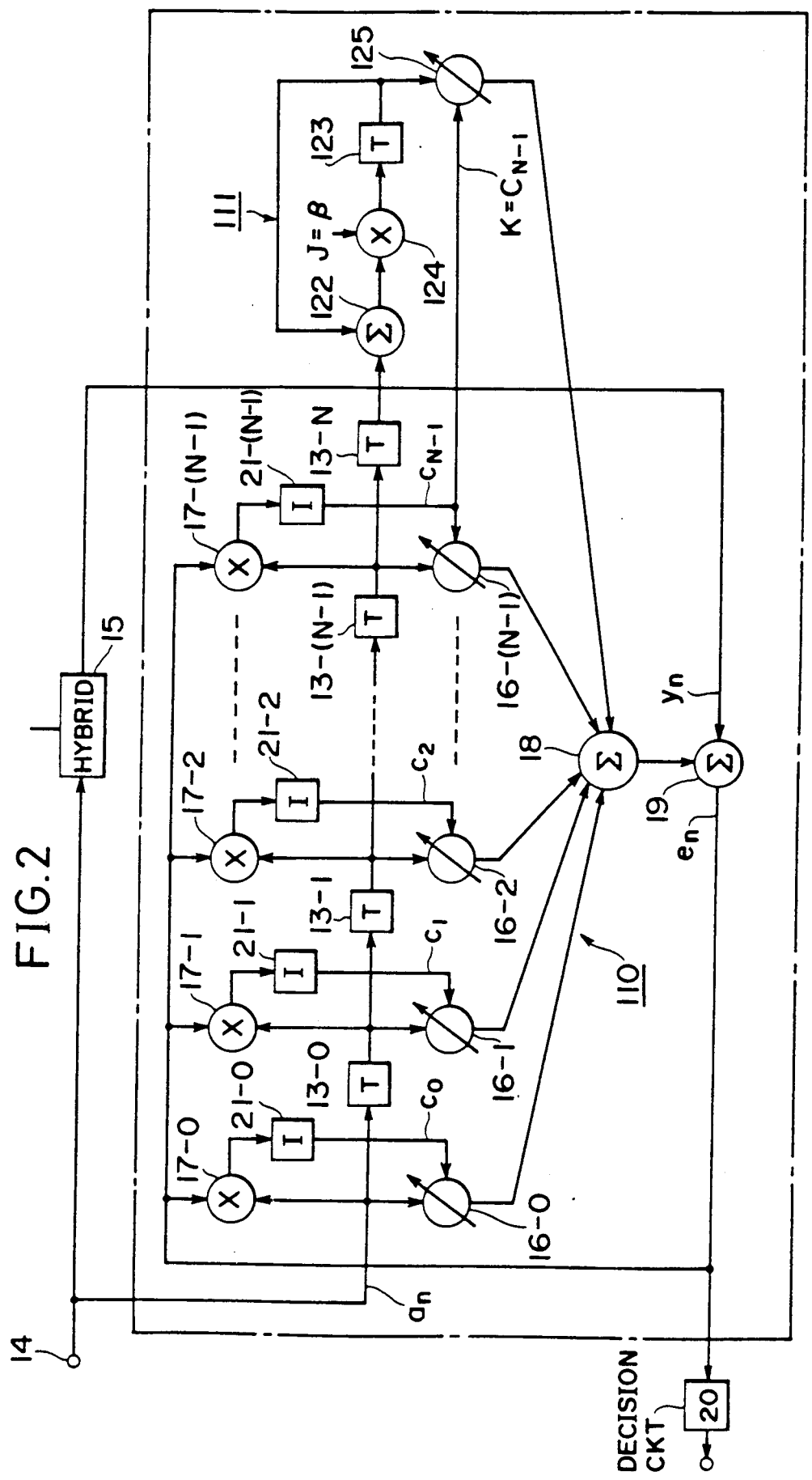
FIG. 2 is a block diagram of an echo canceller according to a second embodiment of the invention.

Since the portion of echo prior to the instant t=NT is canceled by the nonrecursive filter 10 and the tail of echo following that instant decays as a function $\beta^{-t/T}$, (where $\beta$ is a coefficient determined by the inductance of the hybrid 15, the characteristic impedance and distance of the two-wire transmission medium, the embodiment of FIG. 1 can be simplified by setting the tap weights K and J of the recursive filter 11 equal to $C_{N-1}$ and $\beta$, respectively. The simplified embodiment is shown in FIG. 2 in which the second recursive filter 12 is dispensed with and a recursive filter 111 is provided having adder 122, multiplier 124, delay unit 123 and an adaptive multiplier 125. Multiplier 124 multiplies the output of adder 122 with coefficient 8, the output of multiplier 124 being passed through delay unit 123 to the second input of adder 122 to be summed with the output of the delay element 13-N of nonrecursive filter 110. Adaptive multiplier 125 modifies the output of delay unit 123 with tap weight K=$C_{N-1}$.

Figure 3:
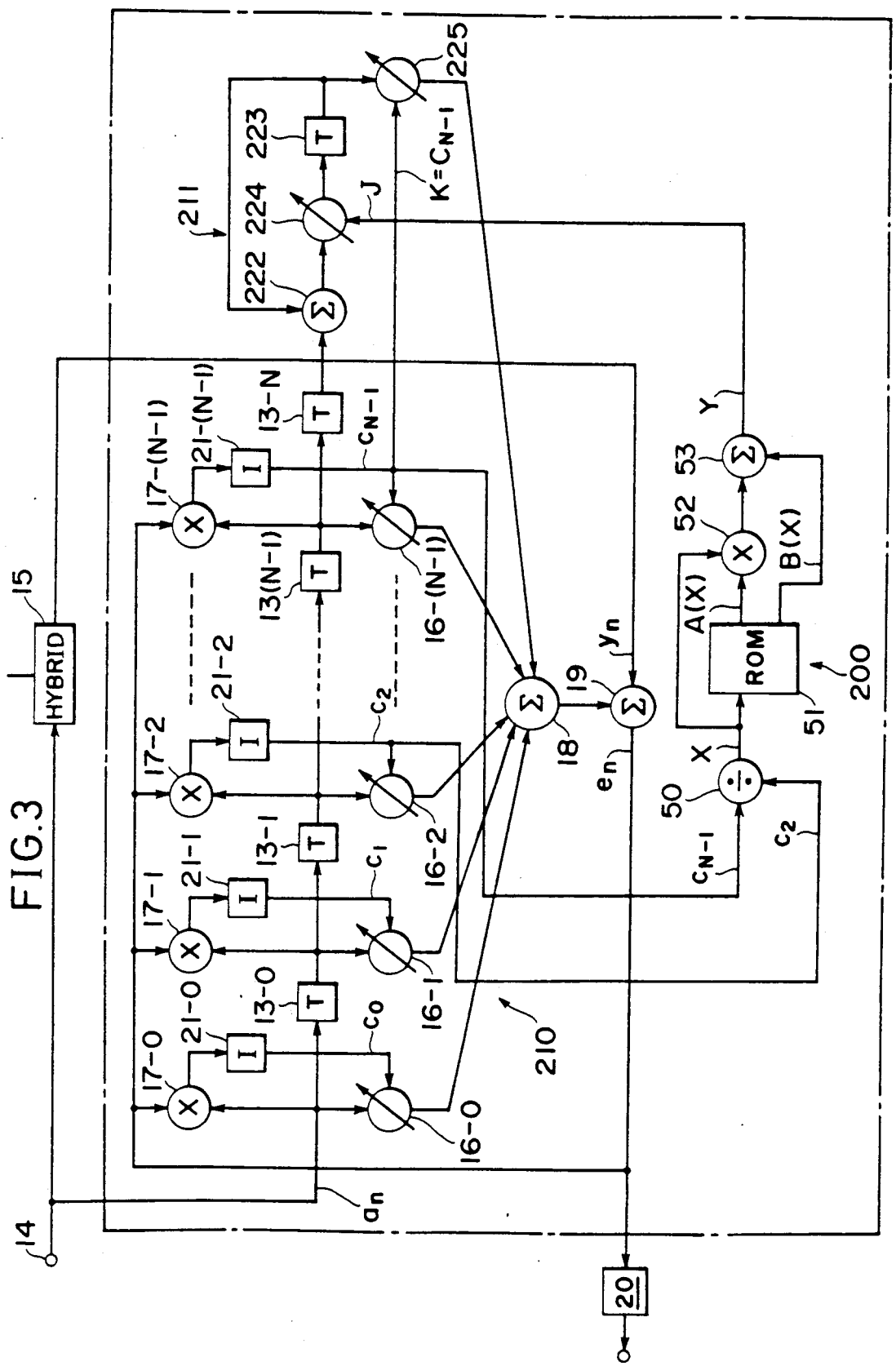
FIG. 3 is a block diagram of an echo canceller according to a third embodiment of the invention.

A further alternative embodiment is shown in FIG. 3 in which the recursive filter 211 includes adder 222 connected to the output of delay element 13-N of nonrecursive filter 210, adaptive multipliers 224 and 225 and delay unit 223. The tap weight J of multiplier 224 is adaptively controlled by a tap control circuit 200 and the tap weight of multiplier 225 is set equal to $C_{N-1}$ as in the previous embodiment. Since tap weights $C_i$ (i=0, 1, ... N-2) and $C_{N-1}$ correspond respectively to echo impulse responses at instants t=iT and t=NT (FIG. 7), respectively, the ratio $C_i/C_{N-1}$ is given by:

$$\frac{C_i}{C_{N-1}} = \beta^{-(i-N)}$$

Therefore, $$\beta = \left(\frac{C_i}{C_{N-1}}\right)^{1/(N-i)} \quad (8)$$

Equation (8) is realized by line-segment approximation using a relation $Y = X^{1/(N-i)}$, where $X = C_i/C_{N-1}$. In FIG. 3, tap weight $C_i$ is taken from the output of integrator 21-2 of nonrecursive filter 210. The tap weight values $C_2$ and $C_{N-1}$ are supplied to a divider 50 to derive a ratio X, which is applied to a read only memory 51. This memory stores a plurality of sets of constants A(X) and B(X) in locations addressable as a function of ratio X. The constant A(X) is applied to a multiplier 52 to multiply the ratio X and summed in an adder 53 with B(X) from the memory 51 to yield the Y-value by an equation $Y = A(X) \cdot X + B(X)$. The output of adder 53 is applied to the tap control input of adaptive multiplier 224.

Figure 4:
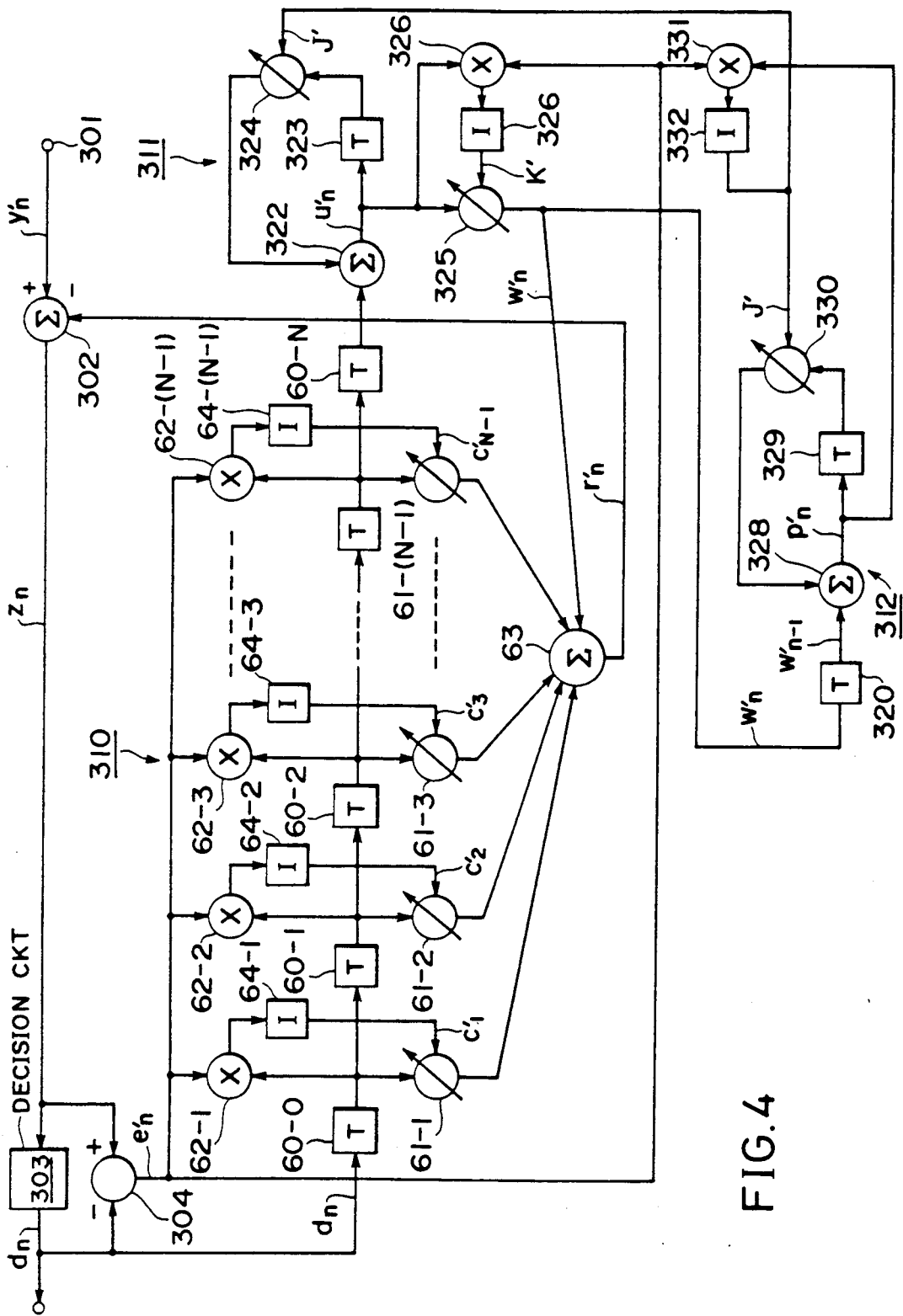
FIG. 4 is a block diagram of a decision threshold equalizer according to a fourth embodiment of the invention.

The digital filter of the present invention can also be used as a decision feedback equalizer as shown in FIG. 4 to cancel intersymbol interference. In this embodiment, the decision feedback equalizer comprises a nonrecursive filter 310, a first recursive filter 311 and a second recursive filter 312. An input bit stream is applied through an input terminal 301 to a subtractor 302 where it is combined with a cancelling signal to produce an output signal "$z_n$", which is fed to a decision circuit 303. The output of decision circuit 303 serves as an input bit stream "$d_n$" to the shift register formed by a series of unit-time delay elements 60-0 through 60-N. Adaptive multipliers 61-1 through 61-(N-1) are respectively coupled to the inputs of delay elements 60-1 through 60-N, the outputs of multipliers 61-1 through 61-(N-1) being summed in an adder 63. A signal representative of a decision error "$e'_n$" is derived from signals "$z_n$" and "$d_n$" by a subtractor 304 and fed to multipliers 62-1 through 62-(N-1) to multiply the inputs of delay elements 60-1 through 60-N with decision error "$e'_n$". The outputs of multipliers 62-1 through 62-(N-1) are respectively supplied to integrators 64-1 through 64-(N-1) identical to those shown in FIG. 1a to generate tap weights $C'_1$ through $C'_{N-1}$ for adaptive multipliers 61-1 through 61-(N-1).

Recursive filter 311 comprises an adder 322 having a first input coupled to the output of delay element 60-N. A unit-time delay element 323 and an adaptive multiplier 324 are connected in a loop from the output of adder 322 to a second input of adder 322. The output of adder 322 is further applied to an adaptive multiplier 325 where it is multiplied with a tap weight K' which is derived from a multiplier 326 by multiplying an output signal "$u'_n$" from adder 322 by the signal "$e'_n$" from subtractor 304 and an integrator 327 which integrates the output of multiplier 326. Multiplier 325 produces an output "$w'_n$" which is applied to the adder 63. Adder 63 generates an output signal "$r'_n$" which is applied to the subtractor 302 as a cancelling signal, or replica of intersymbol interference.

Second recursive filter 312 comprises a unit-time delay element 320 connected to the output of multiplier 325. The output of delay element 320 is summed by an adder 328 with the output of a feedback loop formed by a delay element 329 and an adaptive multiplier 330 to generate an output "$p'_n$" which appears at the output of adder 328. Multiplier 330 has the same tap weight J' as that of multiplier 324.

In order to control the tap weights of multipliers 324 and 330, the output "$e'_n$" of subtractor 304 and the output "$p'_n$" of adder 328 are multiplied by a multiplier 331 and integrated by an integrator 332 and fed to the tap weight control inputs of multipliers 324 and 330.

The replica of an intersymbol interference "$r'_n$" is given by:

$$r'_n = \sum_{i=0}^{N-1} C_i \cdot d_{n-i} + K' \cdot u'_n \quad (9)$$

where, $u'_n$ is represented by a recurrence formula $d_{n-N} + J' \cdot u'_{n-1}$. Since $z_n = y'_n - r'_n$ and $e'_n = z_n - d_n = y'_n - r'_n - d_n$, the relation $\epsilon \Delta E[e_n^2]$ holds as in the previous embodiment. The tap weights $C'_i$ ($i = 0, 1, 2 \ldots N-1$), J' and K' are determined by minimizing the average of squared residual echo by the following partial differential equations:

$$\frac{\partial \epsilon}{\partial C_i} = -2E\left[e'_n \frac{\partial r'_n}{\partial C_i}\right] = -2E[e'_n \cdot d_{n-i}] \quad (10)$$

$$\frac{\partial \epsilon}{\partial K'} = -2E\left[e'_n \frac{\partial r'_n}{\partial K'}\right] = -2E[e'_n \cdot u'_n] \quad (11)$$

$$\frac{\partial \epsilon}{\partial J'} = -2E\left[e'_n \frac{\partial r'_n}{\partial J'}\right] = -2E\left[e'_n \frac{\partial K' \cdot u'_n}{\partial J'}\right]$$

Since $\partial K' \cdot u'_n / \partial J'$ is given by:

$$K' \cdot u'_{n-1} + J' \frac{\partial u'_{n-1}}{\partial J'} \text{ and } w_n = K \cdot u_n$$

and since $w'_n \Delta K' u'n$ and $\partial K' \cdot u'_n / \partial J' \Delta p'_n$, the following relation holds:

$$p'_n = w'_{n-1} + J' \cdot p'_{n-1}$$

Therefore, $$\frac{\partial \epsilon}{\partial J'} = -2E[e'_n \cdot p'_n] \quad (12)$$

Since the input signal $y'_n$ is expressed by:

$$y'_n = \sum_{i=0}^{\infty} a'_n \cdot g_{n-i}$$

where, $a'_n$ is a transmitted bit stream and $g_n$ represents the impulse response of the transmission medium. Assuming that $g_0 = 1$ and $g_{N+m} = g_N \rho^m$ (where $m = 0, 1, \ldots$ infinity, and $\rho$ represents the negative exponential attenuation coefficient ($0 < \rho < 1$) attributed to the first order low-frequency cutoff, tap weights $C'_0$ through $C'_{N-1}$, and K' and J' are represented by:

$$C_i^{(\nu+1)} = C_i^{(\nu)} + \alpha_{C'} \cdot e'_n \cdot a'_{n-i} \quad (13)$$

$$K'^{(\nu+1)} = K'^{(\nu)} + \alpha_{K'} \cdot e'_n \cdot u'_n \quad (14)$$

-continued $$J^{(v+1)} = J^{(v)} + a_J' \cdot e'_n \cdot p'_n \quad (15)$$

where, $a_C'$, $a_K'$ and $a_J'$ are corrective coefficients. Each of the integrators shown in FIG. 4 can therefore be implemented in a manner similar to that shown in FIG. 1a.

Figure 9:
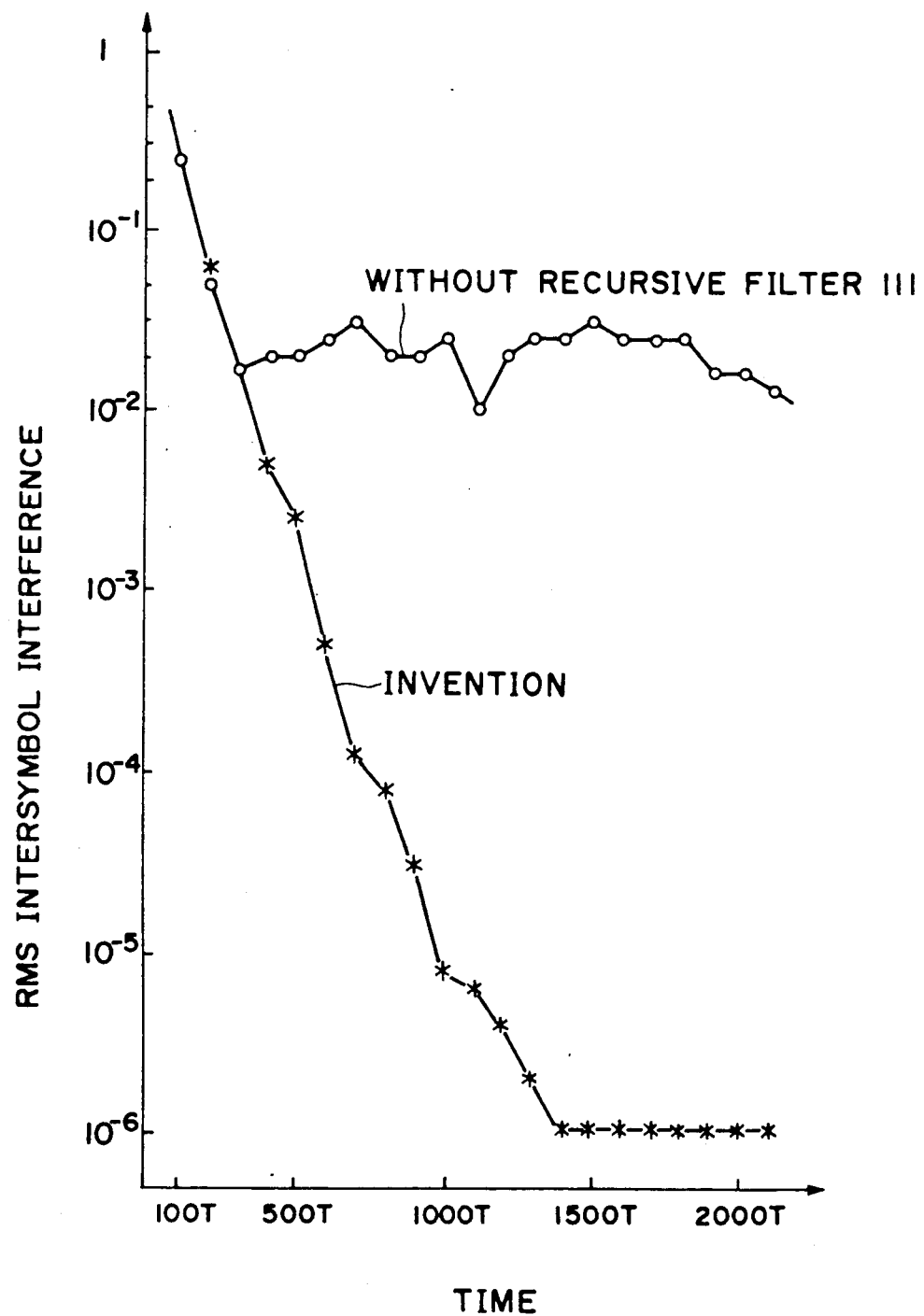
FIG. 9 is a graph showing the results of a simultation test conducted on a decision threshold equalizer of the invention in comparison with a decision threshold equalizer having no recursive filter.

The operating characteristic of the decision feedback equalizer of FIG. 4 was verified by performing a simulation technique on an intersymbol interference having a negative exponential decay response ($\rho = e^{-2\pi/200}$) at a low cut-off frequency which corresponds to 1/200 of the data transmission speed. In this simulation test, the nonrecursive filter 310 was provided with 16 taps (N=16) to cancel a greater part of the intersymbol interference. At time t=NT, the impulse response $g_N$ was 0.005. To cancel the tail of the symbol, the tap weights K' and J' of the recursive filter 311 were 0.005 and 0.96907 (=$\rho$), respectively. The tail of the intersymbol interference was successfully cancelled as indicated in FIG. 9, which favorably compares with the prior art decision feedback equalizer having no recursive filter.

Figure 5:
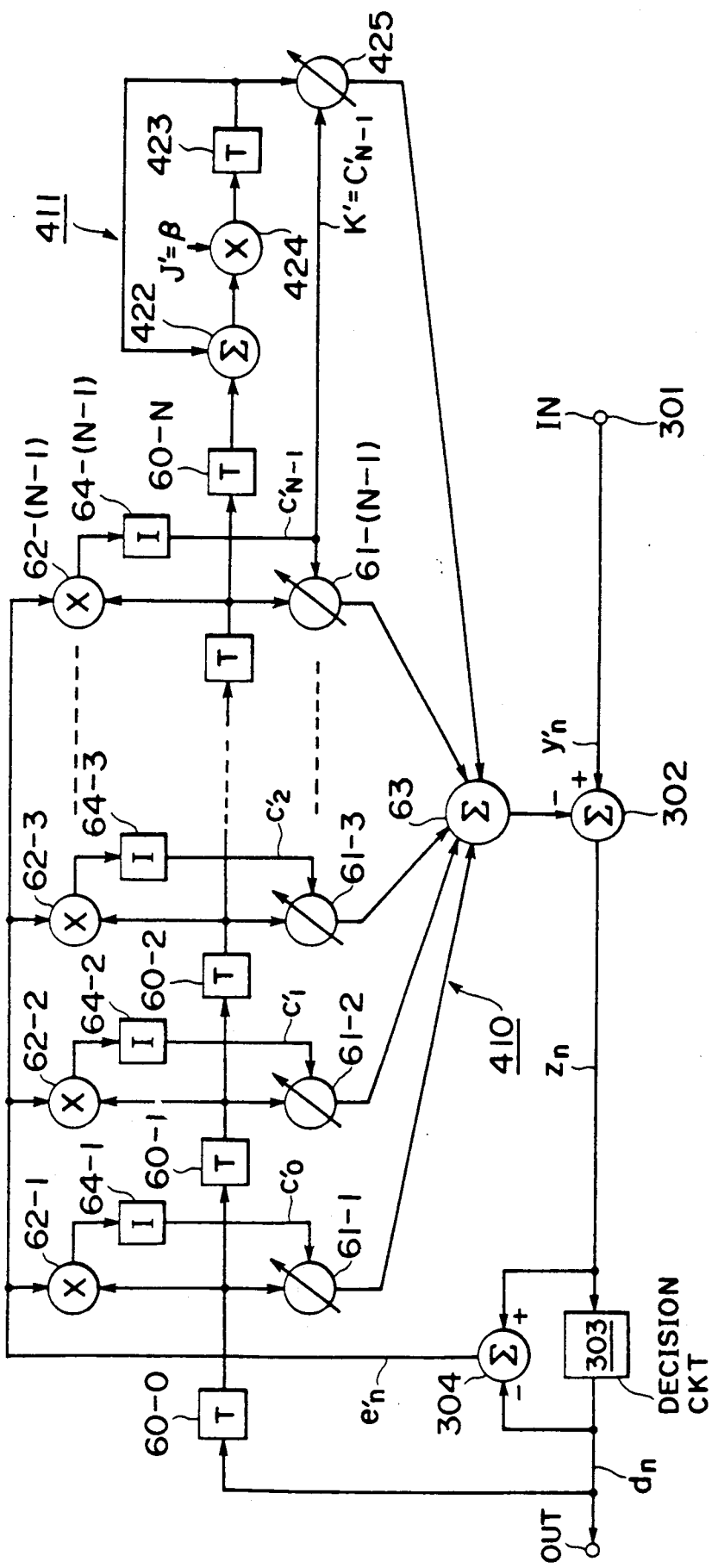
FIG. 5 is a block diagram of a decision threshold equalizer according to a fifth embodiment of the invention.

Since the portion of an intersymbol interference prior to the instant t=NT is cancelled by the nonrecursive filter 310 and the tail of the interference following that instant decays as a function $\beta^{-t/T}$, the embodiments of FIG. 4 can be simplified by setting the tap weights K' and J' of the recursive filter 311 equal to $C'_{N-1}$ and $\beta$, respectively. The simplified embodiment is shown in FIG. 5 in which the second recursive filter 312 is dispensed with and a recursive filter 411 is provided having adder 422, multiplier 424, delay unit 423 and an adaptive multiplier 425. Multiplier 424 multiplies the output of adder 422 with coefficient $\beta$, the output of multiplier 424 being passed through delay unit 423 to the second input of adder 422 to be summed with the output of the delay element 60-N of nonrecursive filter 410. Adaptive multiplier 425 modifies the output of delay unit 423 with tap weight $K' = C'_{N-1}$.

Figure 6:
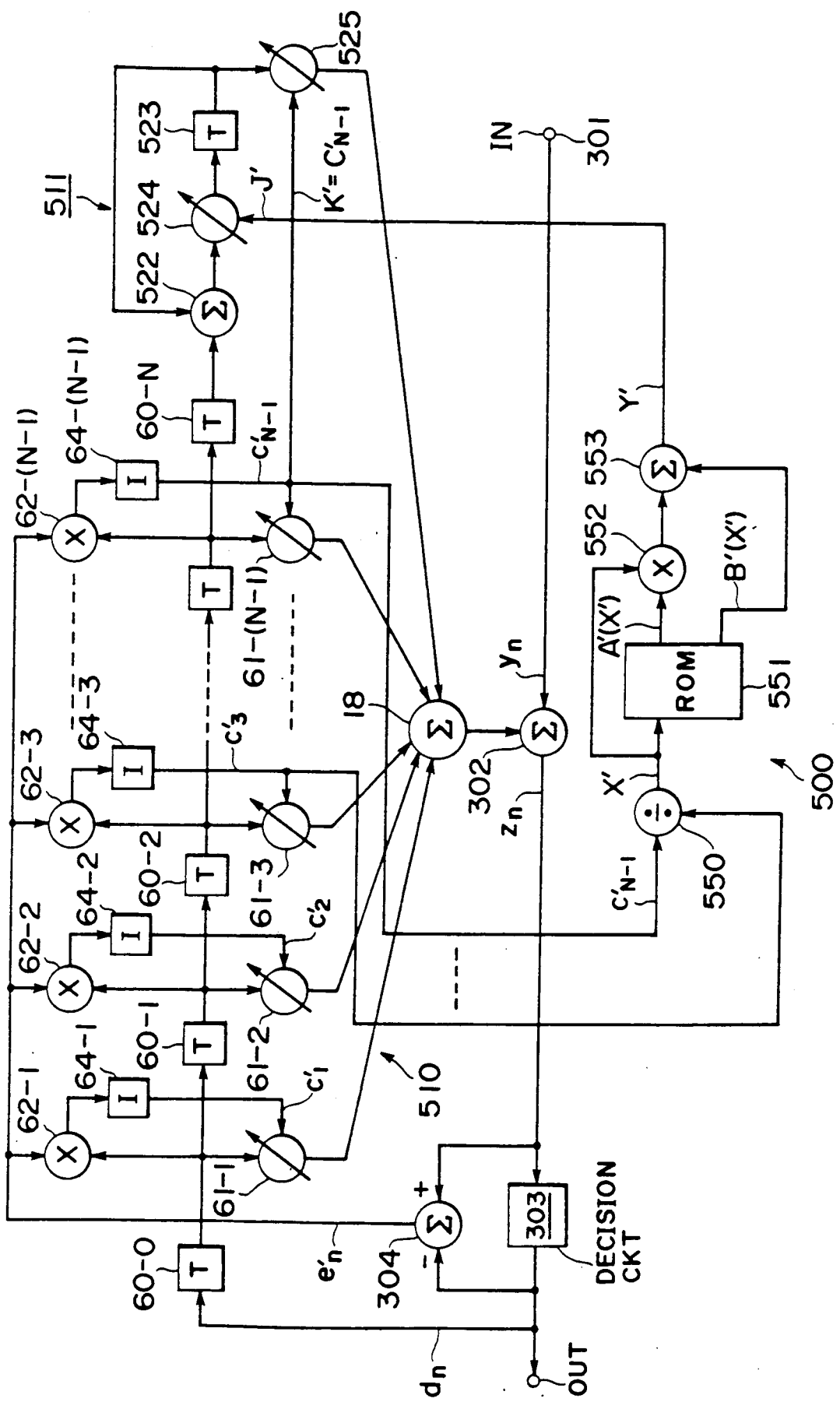
FIG. 6 is a block diagram of a decision threshold equalizer according to a sixth embodiment of the invention.

A further alternative embodiment is shown in FIG. 6 in which recursive filter 511 includes adder 522 connected to the output of delay element 60-N of nonrecursive filter 510, adaptive multipliers 524 and 525 and delay unit 523. The tap weight J' of multiplier 524 is adaptively controlled by a tap control circuit 500 and the tap weight of multiplier 525 is set equal to $C'_{N-1}$ as in FIG. 5. Since tap weights $C'_i$ (i=0, 1, ... N-2) and $C'_{N-1}$ correspond respectively to the amplitudes of a symbol at instants t=iT and t=NT, respectively, the ratio $C'_i/C'_{N-1}$ is given by:

$$\frac{C_i}{C_{N-1}} = \beta^{-(i-N)}$$

Therefore, $$\beta = \left( \frac{C_i}{C_{N-1}} \right)^{1/(N-i)} \quad (16)$$

In a manner similar to that described with reference to FIG. 3, Equation (16) is realized by line-segment approximation using a relation $Y' = X'^{1/(N-i)}$, where $X' = C'_i/C'_{N-1}$. In FIG. 6, tap weight $C'_i$ is taken from the output of integrator 64-3 of nonrecursive filter 510. The tap weight values $C'_3$ and $C'_{N-1}$ are supplied to a divider 550 to derive the ratio X', which is applied to a read only memory 551. This memory stores a plurality of sets of constants A'(X') and B'(X') in locations addressable as a function of the input ratio X'. The constant A'(X') is applied to a multiplier 552 to multiply the ratio X' to obtain A'(X')·X' which is summed in an adder 553 with constant B'(X') from the memory 551 to yield the Y'-value by an equation Y' = A'(X')·X' + B'(X'). The output of adder 553 is applied to the tap control input of adaptive multiplier 524.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

We claim:

1. A circuit for cancelling whole or part of a received waveform, comprising:
    a nonrecursive filter including a plurality of first delay elements for converting a series of symbols into a series of symbols spaced apart a unit time interval, a plurality of first multipliers associated respectively with said delay elements for modifying said spaced apart symbols with first tap weights and an adder for summing outputs of said first multipliers;
    a first recursive filter for recursively modifying an output of said delay elements with a second tap weight;
    a second multiplier for modifying an output of said first recursive filter with a third tap weight and applying the modified output of the first recursive filter to an input of said adder to cause the same to produce a replica of whole or part of said waveform;
    a subtracter for combining said replica with symbols having said waveform; and
    tap weight deriving means for deriving said first and third tap weights from an output of said subtracter.

2. A circuit as claimed in claim 1, wherein said tap weight deriving means for deriving said first tap weights comprises a plurality of first modifying means for modifying said spaced apart symbols of said series with the output of said subtracter to derive said first tap weights.

3. A circuit as claimed in claim 2, wherein each of said first modifying means comprises:
    a third multiplier for multiplying a respective one of said spaced apart symbols with the output of said subtracter;
    a second adder having a first input connected to an output of said third multiplier; and
    a second delay element connected between an output of said second adder and a second input of said second adder to derive a respective one of said first tap weights.

4. A circuit as claimed in claim 1, wherein said second tap weight is equal to a delay constant of a tail portion of said received waveform.

5. A circuit for canceling whole or part of a received waveform, comprising:
    a nonrecursive filter including a plurality of first delay elements for converting a series of symbols into a series of symbols spaced apart a unit time interval, a plurality of first multipliers associated respectively with said delay elements for modifying said spaced apart symbols with first tap weights and an adder for summing outputs of said first multipliers;

a first recursive filter for recursively modifying an output of said delay elements with a second tap weight;

a second multiplier for modifying an output of said first recursive filter with a third tap weight and applying the modified output of the first recursive filter to an input of said adder to cause the same to produce a replica of whole or part of said waveform;

a subtracter for combining said replica with symbols having said waveform; and tap weight deriving means for deriving said first and third tap weights from an output of said subtracter;

a second recursive filter for recursively modifying an output of said second multiplier with said second tap weight; and second modifying means for modifying an output of said second recursive filter with the output of said subtracter to derive said second tap weight.

6. A circuit as claimed in claim 5, wherein said second modifying means comprises:
- a third multiplier for multiplying the output of said second recursive filter with the output of said subtracter;
- a second adder having a first input connected to an output of said third multiplier; and
- a second delay element connected between an output of said second adder and a second input of said second adder to derive said second tap weight (J; J').

7. A circuit as claimed in claim 5, wherein said tap weight deriving means for deriving said third tap weight comprises third modifying means for modifying the output of said first recursive filter with the output of said subtracter to derive said third tap weight.

8. A circuit as claimed in claim 7, wherein said third modifying means comprises:
- a third multiplier for multiplying the output of said recursive filter with the output of said subtracter;
- a second adder having a first input connected to an output of said third multiplier; and
- a second delay element connected between an output of said second adder and a second input of said second adder to derive said third tap weight.

9. A circuit for canceling whole or part of a received waveform, comprising:
- a nonrecursive filter including a plurality of first delay elements for converting a series of symbols into a series of symbols spaced apart a unit time interval, a plurality of first multipliers associated respectively with said delay elements for modifying said spaced apart symbols with first tap weights and an adder for summing outputs of said first multipliers;
- a first recursive filter for recursively modifying an output of said delay elements with a second tap weight;
- a second multiplier for modifying an output of said first recursive filter with a third tap weight and applying the modified output of the first recursive filter to an input of said adder to cause the same to produce a replica of whole or part of said waveform;
- a subtracter for combining said replica with symbols having said waveform; and tap weight deriving means for deriving said first and third tap weights from an output of said subtracter;
- wherein said second tap weight is equal to an attenuation coefficient of a transmission medium; and
- wherein said third tap weight is equal to one of said first tap weights.

10. A circuit for canceling whole or part of a received waveform, comprising:
- a nonrecursive filter including a plurality of first delay elements for converting a series of symbols into a series of symbols spaced apart a unit time interval, a plurality of first multipliers associated respectively with said delay elements for modifying said spaced apart symbols with first tap weights and an adder for summing outputs of said first multipliers;
- a first recursive filter for recursively modifying an output of said delay elements with a second tap weight;
- a second multiplier for modifying an output of said first recursive filter with a third tap weight and applying the modified output of the first recursive filter to an input of said adder to cause the same to produce a replica of whole or part of said waveform;
- a subtracter for combining said replica with symbols having said waveform; and tap weight deriving means for deriving said first and third tap weights from an output of said subtracter;
- wherein said third tap weight is equal to one of said first tap weights, further comprising:
- means for determining a ratio between two of said first tap weights, said two of the first tap weights including said one of the first tap weights; and
- means for deriving said second tap weight as a function of said ratio.

11. A circuit as claimed in claim 10, wherein said means for deriving said second tap weight comprises:
- means for generating a pair of first and second constants as a function of said ratio;
- means for multiplying said first constant by said ratio; and
- means for adding said multiplied constant to said second value and applying a sum to said recursive filter as said second tap weight.

12. An echo canceller comprising:
- a nonrecursive filter including a plurality of first delay elements for converting a series of symbols which are applied to a hybrid into a series of symbols spaced apart a unit time interval, a plurality of first multipliers associated respectively with said delay elements for modifying said spaced apart symbols with first tap weights and an adder for summing outputs of said first multipliers;
- a first recursive filter for recursively modifying an output of said delay elements with a second tap weight;
- a second multiplier for modifying an output of said first recursive filter with a third tap weight and applying an output of the second multiplier to an input of said adder to cause said adder to produce a replica of a symbol transcoupled through said hybrid;
- a subtracter for destructively combining said replica with symbols from said hybrid; and
- tap weight deriving means for deriving said first and third tap weights.

13. An echo canceller as claimed in claim 12, wherein said tap weight deriving means for deriving said first tap weights comprises a plurality of first modifying means for modifying said spaced apart symbols of said series with the output of said subtracter to derive said first tap weights.

14. An echo canceller as claimed in claim 13, wherein each of said first modifying means comprises:
a third multiplier for multiplying a respective one of said spaced apart symbols with the output of said subtracter;
a second adder having a first input connected to an output of said third multiplier; and
a second delay element connected between an output of said second adder and a second input of said second adder to derive a respective one of said first tap weights.

15. An echo canceller comprising:
a nonrecursive filter including a plurality of first delay elements for converting a series of symbols which are applied to a hybrid into a series of symbols spaced apart a unit time interval, a plurality of first multipliers associated respectively with said delay elements for modifying said spaced apart symbols with first tap weights and an adder for summing outputs of said first multipliers;
a first recursive filter for recursively modifying an output of said delay elements with a second tap weight;
a second multiplier for modifying an output of said first recursive filter with a third tap weight and applying an output of the second multiplier to an input of said adder to cause said adder to produce a replica of a symbol transcoupled through said hybrid;
a subtracter for destructively combining said replica with symbols from said hybrid; and
tap weight deriving means for deriving said first and third tap weighs;
a second recursive filter for recursively modifying an output of said second multiplier with said second tap weight; and
second modifying means for modifying an output of said second recursive filter with the output of said subtracter to derive said second tap weight.

16. An echo canceller as claimed in claim 15, wherein said second modifying means comprises:
a third multiplier for multiplying the output of said second recursive filter with the output of said subtracter;
a second adder having a first input connected to an output of said third multiplier; and
a second delay element connected between an output of said second adder and a second input of said second adder to derive said second tap weight.

17. An echo canceller as claimed in claim 15, wherein said tap weight deriving means for deriving said third tap weight comprises third modifying means for modifying the output of said first recursive filter with the output of said subtracter to derive said third tap weight.

18. An echo canceller as claimed in claim 17, wherein said third modifying means comprises:
a third multiplier for multiplying the output of said first recursive filter with the output of said subtracter;
a second adder having a first input connected to an output of said third multiplier; and
a second delay element connected between an output of said second adder and a second input of said second adder to derive said third tap weight.

19. An echo canceller as claimed in claim 12, wherein said second tap weight is equal to a delay constant of a tail portion of said transcoupled symbol.

20. An echo canceller comprising:
a nonrecursive filter including a plurality of first delay elements for converting a series of symbols which are applied to a hybrid into a series of symbols spaced apart a unit time interval, a plurality of first multipliers associated respectively with said delay elements for modifying said spaced apart symbols with first tap weights and an adder for summing outputs of said first multipliers;
a first recursive filter for recursively modifying an output of said delay elements with a second tap weight;
a second multiplier for modifying an output of said first recursive filter with a third tap weight and applying an output of the second multiplier to an input of said adder to cause said adder to produce a replica of a symbol transcoupled through said hybrid;
a subtracter for destructively combining said replica with symbols from said hybrid; and
tap weight deriving means for deriving said first and third tap weights;
wherein said second tap weight is equal to an attenuation coefficient of a transmission medium; and
wherein said third tap weight is equal to one of said first tap weights.

21. An echo canceller comprising:
a nonrecursive filter including a plurality of first delay element for converting a series of symbols which are applied to a hybrid into a series of symbols spaced apart a unit time interval, a plurality of first multipliers associated respectively with said delay elements for modifying said spaced apart symbols with first tap weights and an adder for summing outputs of said first multipliers;
a first recursive filter for recursively modifying an output of said delay elements with a second tap weight;
a second multiplier for modifying an output of said first recursive filter with a third tap weight and applying an output of the second multiplier to an input of said adder to cause said adder to produce a replica of a symbol transcoupled through said hybrid;
a subtracter for destructively combining said replica with symbols from said hybrid; and
tap weight deriving means for deriving said first and third tap weights;
wherein said third tap weight is equal to one of said first tap weights, and further comprising:
means for determining a ratio between two of said first tap weights, said two of the first tap weights including said one of the first tap weights; and
means for deriving said second tap weight as a function of said ratio.

22. An echo canceller as claimed in claim 21, wherein said means for deriving said second tap weight comprises:
means for generating a pair of first and second constants as a function of said ratio;
means for multiplying said first constant by said ratio; and means for adding said multiplied constant to said second value and applying a sum to said recursive filter as said second tap weight.

23. A decision feedback equalizer, comprising:
a decision circuit;
a nonrecursive filter including a plurality of delay elements for converting a series of symbols from said decision circuit into a series of symbols spaced apart a unit time interval, a plurality of first multipliers associated respectively with said delay elements for modifying said spaced apart symbols with first tap weights and an adder for summing outputs of said first multipliers;
a first recursive filter for modifying an output of said first recursive filter with a third tap weight and applying an output of the second multiplier to an input of said adder to cause said adder to produce a replica of an intersymbol interference;
a subtracter for combining said replica with symbols having said intersymbol interference and applying an output signal of the subtracter to said decision circuit; and
tap weight deriving means for deriving said first and third tap weights from an output of said subtracter.

24. A decision feedback equalizer as claimed in claim 23, wherein said third tap weight is equal to one of said first tap weights, further comprising:
means for determining a ratio between two of said first tap weights, said two of the first tap weights including said one of the first tap weights; and
means for deriving said second tap weight as a function of said ratio.

25. A decision feedback equalizer as claimed in claim 24, wherein said means for deriving said second tap weight comprises:
means for generating a pair of first and second constants as a function of said ratio;
means for multiplying said first constant by said ratio; and
means for adding said multiplied constant to said second value and applying a sum to said recursive filter as said second tap weight.

26. A decision feedback equalizer as claimed in claim 23, wherein said tap weight deriving means for deriving said first tap weights comprises a plurality of first modifying means for modifying said spaced apart symbols of said series with the output of said subtracter to derive said first tap weights.

27. A decision feedback equalizer as claimed in claim 26, wherein each of said first modifying means comprises:
a third multiplier for multiplying a respective one of said spaced apart symbols with the output of said subtracter;
a second adder having a first input connected to an output of said third multiplier; and
a second delay element connected between an output of said second adder and a second input of said second adder to derive a respective one of said first tap weights.

28. A decision feedback equalizer as claimed in claim 23, wherein said second tap weight is equal to an attenuation coefficient of a transmission medium.

29. A decision feedback equalizer as claimed in claim 28, wherein said third tap weight is equal to one of said first tap weights.

30. A decision feedback equalizer as claimed in claim 23, further comprising:
a second recursive filter for recursively modifying an output of said second multiplier with said second tap weight; and
second modifying means for modifying an output of said second recursive filter with the output of said subtracter to derive said second tap weight.

31. A decision feedback equalizer as claimed in claim 30, wherein said second modifying means comprises:
a third multiplier for multiplying the output of said second recursive filter with the output of said subtracter;
a second adder having a first input connected to an output of said third multiplier; and
a second delay element connected between an output of said second adder and a second input of said second adder to derive said second tap weight.

32. A decision feedback equalizer as claimed in claim 30, wherein said tap weight deriving means for deriving said third tap weight comprises third modifying means for modifying the output of said first recursive filter with the output of said subtracter to derive said third tap weight.

33. A decision feedback equalizer as claimed in claim 32, wherein said third modifying means comprises:
a third multiplier for multiplying the output of said recursive filter with the output of said subtracter;
a second adder having a first input connected to an output of said third multiplier; and
a second delay element connected between an output of said second adder and a second input of said second adder to derive said third tap weight.

* * * * *

UNITED STATES PATENT AND TRADEMARK OFFICE
CERTIFICATE OF CORRECTION

PATENT NO. : 5,042,026
DATED : August 20, 1991
INVENTOR(S) : Shin'ichi KOIKE, Masaru YAMAGUCHI, and Masanobu ARAI It is certified that error appears in the above-indentified patent and that said Letters Patent is hereby corrected as shown below:

Col. 3, line 33, delete "$\Delta$" and insert -- $\Delta$ --;
Col. 4, line 51, delete "8" and insert --$\beta$--;
Col. 6, line 19, delete "$\Delta$" and insert -- $\Delta$ --;
Col. 6, line 41, delete both occurrences of "$\Delta$" and insert -- $\underline{\Delta}$ --;
Col. 6, line 65, delete the second occurrence of ".e'$_n$"
Col. 11, line 40, delete "weighs" and insert --weights--.

Signed and Sealed this

Twenty-fifth Day of October, 1994

Attest:

BRUCE LEHMAN

Attesting Officer           Commissioner of Patents and Trademarks